US012787539B2

(12) United States Patent
Du et al.

(10) Patent No.: US 12,787,539 B2
(45) Date of Patent: Nov. 3, 2026

(54) LIGHT-EMITTING DEVICE AND PREPARATION METHOD THEREOF, AND DISPLAY APPARATUS

(71) Applicant: BOE Technology Group Co., Ltd., Beijing (CN)

(72) Inventors: Xiaobo Du, Beijing (CN); Haidong Wu, Beijing (CN); Yansong Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 818 days.

(21) Appl. No.: 18/020,714

(22) PCT Filed: Mar. 28, 2022

(86) PCT No.: PCT/CN2022/083462

§ 371 (c)(1),
(2) Date: Feb. 10, 2023

(87) PCT Pub. No.: WO2023/184103

PCT Pub. Date: Oct. 5, 2023

(65) Prior Publication Data

US 2024/0292649 A1 Aug. 29, 2024

(51) Int. Cl.
*H10K 50/17* (2023.01)
*H10K 50/155* (2023.01)
(Continued)

(52) U.S. Cl.
CPC ......... *H10K 50/171* (2023.02); *H10K 50/155* (2023.02); *H10K 50/165* (2023.02);
(Continued)

(58) Field of Classification Search
CPC .. H10K 50/171; H10K 50/155; H10K 50/165; H10K 71/10; H10K 85/111;
(Continued)

(56) References Cited

U.S. PATENT DOCUMENTS

2017/0092890 A1* 3/2017 Seo ........................ C09K 11/02
2018/0149595 A1 5/2018 Adachi et al.
2024/0090303 A1* 3/2024 Kubota .................. G06F 3/041

FOREIGN PATENT DOCUMENTS

CN 111769199 A 10/2020

* cited by examiner

*Primary Examiner* — Fernando L Toledo
*Assistant Examiner* — Jorge Andres Lopez
(74) *Attorney, Agent, or Firm* — WHDA, LLP

(57) ABSTRACT

A light-emitting device includes at least one light-emitting unit including a luminescent layer, an electron functional layer and a hole functional layer; a material of the luminescent layer includes host materials and guest materials, the host materials include hole transport materials and electron transport materials; a material of the electron functional layer is the same as the electron transport materials, and a material of the hole functional layer is the same as the hole transport materials; an energy value $HOMO_A$ of a highest occupied molecular orbital of the hole transport materials and an energy value $HOMO_B$ of a highest occupied molecular orbital of the electron transport materials satisfy: $HOMO_A-HOMO_B>0.2$ eV; and an energy value $LUMO_A$ of a lowest unoccupied molecular orbital of the hole transport materials and an energy value $LUMO_B$ of a lowest unoccupied molecular orbital of the electron transport materials satisfy: $LUMO_A-LUMO_B>0.2$ eV.

20 Claims, 5 Drawing Sheets

(51) Int. Cl.
*H10K 50/165* (2023.01)
*H10K 71/10* (2023.01)
*H10K 85/10* (2023.01)
*H10K 85/30* (2023.01)
*H10K 85/60* (2023.01)
*H10K 101/30* (2023.01)
*H10K 101/40* (2023.01)
*H10K 102/00* (2023.01)

(52) U.S. Cl.
CPC ........... *H10K 71/10* (2023.02); *H10K 85/111* (2023.02); *H10K 85/371* (2023.02); *H10K 85/633* (2023.02); *H10K 85/6572* (2023.02); *H10K 85/6574* (2023.02); *H10K 2101/30* (2023.02); *H10K 2101/40* (2023.02); *H10K 2102/351* (2023.02)

(58) Field of Classification Search
CPC ............... H10K 85/371; H10K 85/633; H10K 85/6572; H10K 85/6574; H10K 2101/30; H10K 2101/40; H10K 2102/351; H10K 50/00; H10K 50/11; H10K 85/654
See application file for complete search history.

LIGHT-EMITTING DEVICE AND PREPARATION METHOD THEREOF, AND DISPLAY APPARATUS

TECHNICAL FIELD

The present application relates to the technical field of displaying and more particularly, to a light-emitting device and a preparation method thereof, and a display apparatus.

BACKGROUND

Organic light-emitting diodes (OLED) have been widely used in the field of flat panel display and lighting due to its advantages of high brightness, high color saturation, light weight and flexibility. OLED panels have many advantages, such as wide selection range of materials, full color display of 380 nm-700 nm spectral area, wide viewing angle, fast response speed, low driving voltage, flexible display, etc., and have been rapidly developed and applied in the past 20 years. OLEDs use organic small-molecular semiconductor materials as functional materials to complete carrier transmission and recombination under the driving of external electric field, thus forming excitons, and it is to realized luminescence by the radiation transition of the excitons. At present, mass production OLEDs have high production costs and low yield, which need further optimization.

SUMMARY

The embodiments of the present application employ the following technical solutions:

In one aspect, a light-emitting device is provided, including: at least one light-emitting unit, wherein the light-emitting unit includes: a luminescent layer, an electron functional layer and a hole functional layer, and the electron functional layer and the hole functional layer are disposed on opposite sides of the luminescent layer;

- a material of the luminescent layer includes: host materials and guest materials doped in the host materials, and the host materials include: hole transport materials and electron transport materials;
- a material of the electron functional layer is the same as the electron transport materials, and a material of the hole functional layer is the same as the hole transport materials;
- wherein an energy value $HOMO_A$ of a highest occupied molecular orbital of the hole transport materials and an energy value $HOMO_B$ of a highest occupied molecular orbital of the electron transport materials satisfy: $HOMO_A - HOMO_B > 0.2$ eV; and an energy value $LUMO_A$ of a lowest unoccupied molecular orbital of the hole transport materials and an energy value $LUMO_B$ of a lowest unoccupied molecular orbital of the electron transport materials satisfy: $LUMO_A - LUMO_B > 0.2$ eV.

Optionally, the energy value $HOMO_A$ of the highest occupied molecular orbital of the hole transport materials satisfies: $-5.7\ eV \le HOMO_A \le -5.1$ eV; and the energy value $LUMO_A$ of the lowest unoccupied molecular orbital of the hole transport materials satisfies: $-2.7\ eV \le LUMO_A \le -2.0$ eV; and the energy value $HOMO_B$ of the highest occupied molecular orbital of the electron transport materials satisfies: $-6.2\ eV \le HOMO_B \le -5.4$ eV; and the energy value $LUMO_B$ of the lowest unoccupied molecular orbital of the electron transport materials satisfies: $-3.1\ eV \le LUMO_B \le -2.3$ eV.

Optionally, the light-emitting unit further includes: an anode and a cathode, the anode is disposed on a side of the hole functional layer away from the luminescent layer, and the cathode is disposed on a side of the electron functional layer away from the luminescent layer.

Optionally, the light-emitting unit further includes: a hole transport layer and an electron transport layer; the hole transport layer is disposed on a side of the hole functional layer close to the anode and in contact with the hole functional layer; and the electron transport layer is disposed on a side of the electron functional layer close to the cathode and in contact with the electron functional layer.

Optionally, the light-emitting unit further includes: a hole injection layer and an electron injection layer; the hole injection layer is disposed on a side of the hole transport layer close to the anode and in contact with the anode; and the electron injection layer is disposed on a side of the electron transport layer close to the cathode and in contact with the cathode.

Optionally, a thickness range of the hole functional layer is 5-200 nm, and a thickness range of the electron functional layer is 5-20 nm.

Optionally, the light-emitting unit is a red light-emitting unit, the thickness range of the hole functional layer is 5-150 nm, and the thickness range of the electron functional layer is 5-20 nm.

Optionally, the light-emitting unit is a green light-emitting unit, the thickness range of the hole functional layer is 5-100 nm, and the thickness range of the electron functional layer is 5-20 nm.

Optionally, the light-emitting unit is a blue light-emitting unit, the thickness range of the hole functional layer is 5-40 nm, and the thickness range of the electron functional layer is 5-20 nm.

Optionally, the light-emitting unit further includes: a hole injection layer and an electron injection layer; the hole injection layer is disposed on a side of the hole functional layer close to the anode and in contact with the hole functional layer; and the electron injection layer is disposed on a side of the electron functional layer close to the cathode and in contact with the electron functional layer.

Optionally, the hole functional layer is in contact with the anode, and the electron functional layer is in contact with cathode.

Optionally, a thickness range of the hole functional layer is 5-300 nm, and a thickness range of the electron functional layer is 5-100 nm.

Optionally, the light-emitting unit is a red light-emitting unit, the thickness range of the hole functional layer is 5-300 nm, and the thickness range of the electron functional layer is 5-100 nm.

Optionally, the light-emitting unit is a green light-emitting unit, the thickness range of the hole functional layer is 5-250 nm, and the thickness range of the electron functional layer is 5-100 nm.

Optionally, the light-emitting unit is a blue light-emitting unit, the thickness range of the hole functional layer is 5-200 nm, and the thickness range of the electron functional layer is 5-100 nm.

Optionally, a material of the anode includes: transparent materials, and a material of the cathode includes: opaque materials; or, the material of the anode includes: opaque materials, and the material of the cathode includes: transparent materials.

Optionally, the hole transport materials include: aromatic amine materials or branched polymer family materials, and the electron transport materials include: aromatic compound materials.

Optionally, the hole transport materials include: a compound C and/or a derivative of the compound C, and the compound C includes: triphenylamine, fluorene, spirofluorene or phenothiazine; and the electron transport materials include: heterocyclic compound, the heterocyclic compound includes: a D functional group and an E atom, the D functional group includes: naphthalene, anthracene, quinoline or triazine, and the E atom includes: nitrogen atom, phosphonous atom or sulfur atom.

Optionally, the light-emitting unit is a red light-emitting unit, the hole transport materials include: a triphenylamine group and a dibenzothiophene functional group, or the triphenylamine group and a dibenzofuran functional group; the electron transport materials include: a first group and a first functional group, the first group includes: a triazine group, a quinoline group, a naphthalene group or an anthracene group, and the first functional group includes: a carbazole functional group or a fluorene functional group.

Optionally, the light-emitting unit is a green light-emitting unit, the hole transport materials include: a triphenylamine group and a carbazole functional group, or the triphenylamine group and a spirofluorene functional group, and the electron transport materials include: a triazine group and a carbazole functional group, or the triazine group and a dibenzofuran functional group.

Optionally, the light-emitting unit is a blue light-emitting unit, the hole transport materials include: a triphenylamine group, a second functional group and a third functional group, the second functional group includes a carbazole functional group or a spirofluorene functional group, the third functional group includes a naphthalene functional group or an anthracene functional group, the electron transport materials include a fourth functional group, and the fourth functional group includes: a triazine functional group, the naphthalene functional group, the anthracene functional group or a fluorene functional group.

Optionally, the light-emitting unit is a red light-emitting unit, and a thickness range of the luminescent layer is 20-80 nm.

Optionally, the light-emitting unit is a green light-emitting unit, and a thickness range of the luminescent layer is 20-60 nm.

Optionally, the light-emitting unit is a blue light-emitting unit, and a thickness range of the luminescent layer is 10-50 nm.

Optionally, a range of a doping ratio of the guest materials in the luminescent layer includes: 0.1%-20%.

In another aspect, a display apparatus is provided, including the above light-emitting device.

In yet another aspect, a preparation method of the above light-emitting device is provided, including:

forming at least one light-emitting unit; and the forming at least one light-emitting unit includes:

forming a luminescent layer, an electron functional layer and a hole functional layer, wherein the electron functional layer and the hole functional layer are disposed on opposite sides of the luminescent layer; a material of the luminescent layer includes: host materials, and guest materials doped in the host materials, the host materials include: hole transport materials and electron transport materials; a material of the electron functional layer is the same as the electron transport materials, and a material of the hole functional layer is the same as the hole transport materials; an energy value $HOMO_A$ of a highest occupied molecular orbital of the hole transport materials and an energy value $HOMO_B$ of a highest occupied molecular orbital of the electron transport materials satisfy: $HOMO_A-HOMO_B>0.2$ eV; and an energy value $LUMO_A$ of a lowest unoccupied molecular orbital of the hole transport materials and an energy value $LUMO_B$ of a lowest unoccupied molecular orbital of the electron transport materials satisfy: $LUMO_A-LUMO_B>0.2$ eV.

Optionally, the forming a luminescent layer, an electron functional layer and a hole functional layer includes:

evaporating by using a same evaporation chamber to form the luminescent layer, the electron functional layer and the hole functional layer.

The above description is merely a summary of the technical solutions of the present application. In order to more clearly know the technological means of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the drawings that are required to describe the embodiments or the related art will be briefly described below. Apparently, the drawings that are described below are merely embodiments of the present application, and a person skilled in the art may obtain other drawings according to these drawings without paying creative work.

DETAILED DESCRIPTION

In order to make the purpose, technical solutions and advantages of the embodiments of the present application clearer, the technical solutions in the embodiments of the present application will be described clearly and completely in combination with the drawings in the embodiments of the present application. Obviously, the described embodiments are part of the embodiments of the present application, not all of them. Based on the embodiments in the present application, all other embodiments obtained by those skilled in the art without creative work fall within the scope of protection in the present application.

In the embodiment of the present application, the words "first", "second", "third", "fourth" and other words are used to distinguish the same or similar items with basically the same function and action, only for the purpose of clearly describing the technical solutions of the embodiments of the present application, and cannot be understood as indicating or implying the relative importance or implying the quantity of the indicated technical features. In addition. "a plurality of" means two or more, "at least one" means one or more, unless otherwise specified.

Figure 1:
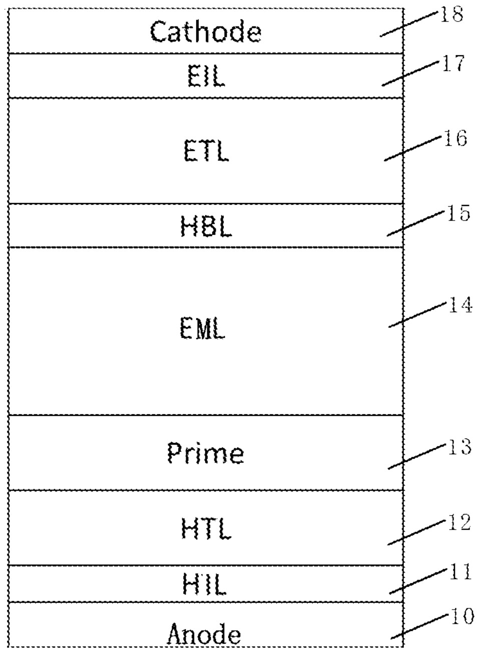
FIG. 1 illustrates a schematic structural diagram of an OLED light-emitting device.

In related art, referring to FIG. 1, an OLED light-emitting device includes an Anode electrode (anode) 10, a HIL layer (hole injection layer) 11, a HTL layer (hole transport layer) 12, a Prime layer (luminescent precursor layer) 13, an EML layer (luminescent layer) 14, a HBL layer (hole barrier layer) 15, an ETL layer (electric transport layer) 16, an EIL layer (electric injection layer) 17 and a Cathode electrode (cathode) 18. Among them, the material of the luminescent layer include host materials and guest materials. When the Prime layer, the EML layer and the HBL layer are formed by the evaporation process, three evaporation chambers are required, and three evaporation masks are required at the same time, and three times of alignment are carried out. The overall evaporation time is long, the yield is low, and the possibility of deterioration of different materials is also high. The OLED light-emitting device has high production cost and low yield, and needs further optimization.

Based on the above, the embodiment of the present application provides a light-emitting device, including: at least one light-emitting unit 100 shown in FIG. 2 to FIG. 6, the light-emitting unit 100 includes: a luminescent layer 1, an electron functional layer 2 and a hole functional layer 3, and the electron functional layer 2 and the hole functional layer 3 are disposed on opposite sides of the luminescent layer 1.

The material of the luminescent layer includes: the host materials and the guest materials doped in the host materials, and the host materials include: hole transport materials and electron transport materials.

A material of the electron functional layer is the same as the electron transport materials, and a material of the hole functional layer is the same as the hole transport materials.

An energy value $HOMO_A$ of a highest occupied molecular orbital of the hole transport materials and an energy value $HOMO_B$ of a highest occupied molecular orbital of the electron transport materials satisfy: $HOMO_A-HOMO_B>0.2$ eV; and an energy value $LUMO_A$ of a lowest unoccupied molecular orbital of the hole transport materials and an energy value $LUMO_B$ of a lowest unoccupied molecular orbital of the electron transport materials satisfy: $LUMO_A-LUMO_B>0.2$ eV.

The above light-emitting device may include light-emitting units of the same luminous color, such as a red light-emitting unit, a green light-emitting unit or a blue light-emitting unit. Applying the light-emitting device to a display apparatus may achieve single-color screen display. Alternatively, the light-emitting device includes a variety of light-emitting units with various luminous colors at the same time, for example, including the red light-emitting unit, the green light-emitting unit and the blue light-emitting unit at the same time. Applying the light-emitting device to the display apparatus may realize color display.

The host materials of the above luminescent layer include the hole transport materials and the electron transport materials, belonging to the type of double host materials. The hole transport materials are conducive to the transmission of holes, and the electron transport materials are conducive to the transmission of electrons. In order to limit the electrons and the holes in the luminescent layer to obtain higher luminous efficiency, the hole functional layer should at least have the characteristics of blocking the electrons, and the electric functional layer should at least have the characteristics of blocking the holes, so the energy levels of the hole transport materials and the electric transport materials need to be limited.

In the frontier orbital theory, the molecular orbital with the highest energy level among the molecular orbitals occupied by the electrons is called the highest occupied molecular orbital (HOMO), and the molecular orbital with the lowest energy level among the molecular orbitals unoccupied by the electrons is called the lowest unoccupied molecular orbital (LUMO).

The energy value $HOMO_A$ of the highest occupied molecular orbital of the hole transport materials and the energy value $HOMO_B$ of the highest occupied molecular orbital of the electron transport materials satisfy: $HOMO_A-HOMO_B>0.2$ eV. Which is conducive to the electric functional layer to block the holes, thus preventing the emigration of the holes in the luminescent layer. The energy value $LUMO_A$ of the lowest unoccupied molecular orbital of the hole transport materials and the energy value $LUMO_B$ of the lowest unoccupied molecular orbital of the electron transport materials satisfy: $LUMO_A-LUMO_B>0.2$ eV. Which is conducive to the hole functional layer to block the electrons, and to block the emigration of the electrons in the luminescent layer. By setting the hole functional layer and the electric functional layer, the luminous area is limited in the luminescent layer to prevent the energy of the luminescent layer from diffusing to the surrounding functional layers, thus improving the luminous efficiency of the light-emitting device.

There is no specific restriction on the types of the hole transport materials, the electric transport materials and the guest materials, as long as they meet the corresponding energy level requirements. The above guest materials may include phosphorescent materials or fluorescent materials. For example, the guest materials may include any one of $Ir(ppy)_3$, $Be(PP)_2$, and PPF. Here $Ir(ppy)_3$ refers to tris(2-phenylpyridine)iridium; $Be(PP)_2$ refers to bis[2-(2-Pyridinyl)phenolato]beryllium; PPF refers to polymer polyethylene polypropylene fiber, and its chemical structure formula is

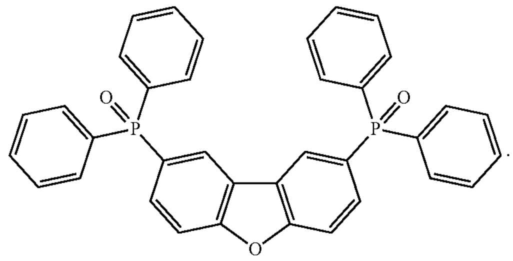 [SMILES: O=P(c1ccccc1)(c1ccccc1)c1ccc2oc3ccc(P(=O)(c4ccccc4)c4ccccc4)cc3c2c1]

The material of the electron functional layer is the same as a kind of the host materials of the luminescent layer (that is, the electron transport materials), and the material of the hole functional layer is the same as a kind of the host materials of the luminescent layer (that is, the hole transport materials). Then, when the evaporation process is used to form the electric functional layer, the luminescent layer and the hole functional layer, only one evaporation chamber and one evaporation mask plate may be needed, thus shortening the overall evaporation time, with high yield and low production cost. The light-emitting device has a simple structure and low cost.

In order to further limit the luminous area to the luminescent layer and further improve the luminous efficiency.

Optionally, the energy value $HOMO_A$ of the highest occupied molecular orbital of the hole transport materials satisfies: −5.7 eV≤$HOMO_A$≤−5.1 eV, for example, $HOMO_A$ may be −5.7 eV, −5.5 eV, −5.3 eV or −5.1 eV. The energy value $LUMO_A$ of the lowest unoccupied molecular orbital of the hole transport materials satisfies: −2.7 eV≤$LUMO_A$≤−2.0 eV, for example, $LUMO_A$ may be −2.7 eV, −2.5 eV, −2.3 eV or −2.0 eV.

The energy value $HOMO_B$ of the highest occupied molecular orbital of the electron transport materials satisfies: −6.2 eV≤$HOMO_B$≤−5.4 eV, for example, $HOMO_B$ may be −6.2 eV, −6.0 eV, −5.8 eV, −5.6 eV or −5.4 eV. The energy value $LUMO_B$ of the lowest unoccupied molecular orbital of the electron transport materials satisfies: −3.1 eV≤$LUMO_B$≤−2.3 eV, for example, $LUMO_B$ may be −3.1 eV, −2.9 eV, −2.7 eV, −2.5 eV or −2.3 eV.

The light-emitting device is a current driver, that is, the brightness increases with the increase of current density under the external bias voltage. In order to facilitate to provide a voltage to form an electric field, optionally, referring to FIG. 2-FIG. 6, the light-emitting unit also includes: an anode 4 and a cathode 5, the anode 4 is set on a side of hole functional layer 3 away from the luminescent layer 1, and the cathode 5 is set on a side of the electric functional layer 2 away from the luminescent layer 1. There are no restrictions on the materials of the anode and the cathode. For example, the cathode and the anode may be formed by using the metal or the metal oxide, respectively. For example, the material of the anode includes indium tin oxide (TO), and the material of the cathode includes metal aluminum.

A light-emitting device is provided below, in one or more embodiments, in order to further improve the transmission efficiency of the holes and the electrons, referring to FIG. 2 and FIG. 3, the light-emitting unit further includes: a hole transport layer 6 and an electron transport layer 7; the hole transport layer 6 is disposed on a side of the hole functional layer 3 close to the anode 4 and in contact with the hole functional layer 3; the electron transport layer 7 is disposed on a side of the electron functional layer 2 close to the cathode 5 and in contact with the electron functional layer 2.

In this structure, the electric functional layer is used to block the holes, which is equivalent to the hole barrier layer; the hole functional layer is used to block the electrons, which is equivalent to the luminescent precursor layer or the electron barrier layer. There are no restrictions on the materials of the hole transport layer and the electric transport layer. For example, the material of the hole transport layer includes any one of NPB, TPD, m-MTDATA and SPPO13. NPB is N,N'-Bis(1-naphthalenyl)-N,N'-bisphenyl-(1,1'-biphenyl)-4,4'-diamine, and its chemical structure formula is

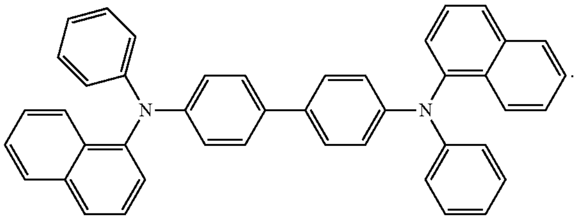 [SMILES: c1ccc(N(c2ccc(-c3ccc(N(c4ccccc4)c4cccc5ccccc45)cc3)cc2)c2cccc3ccccc23)cc1]

TPD is N,N'-Bis(3-methylphenyl)-N,N-diphenyl-benzidine, m-MTDATA is 4,4',4"-Tris(N-3-methylphenyl-N-phenylamino)triphenylamine, and SPPO13 is 2,7-bis(diphenylphosphoryl)-9,9'-spirobi[fluorene]. The material of the electron transport layer may include anyone of Bphen, TPBI, BCP and B3PYMPM. Here, Bphen is 1,10-Phenanthroline, and its chemical structure formula is

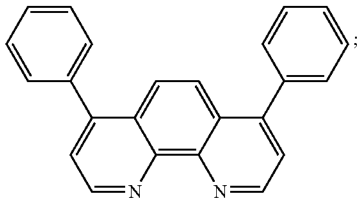 [SMILES: c1ccc(-c2ccnc3c2ccc2c(-c4ccccc4)ccnc23)cc1]

TPBI is 1,3,5-Tris(1-phenyl-1H-benzimidazol-2-yl)benzene, BCP is 2,9-Dimethyl-4,7-diphenyl-1,10-phenanthroline, and B3PYMPM is 4,6-Bis(3,5-di-3-pyridyl phenyl)-2-methylpyrimidine.

Figure 2:
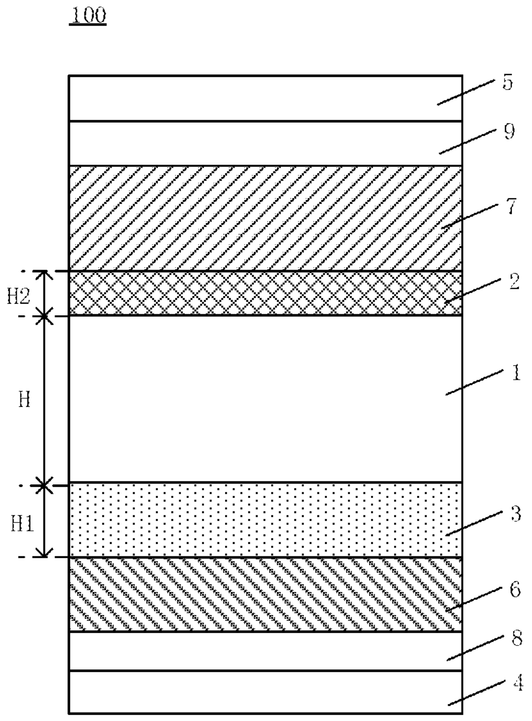
FIG. 2 to FIG. 6 illustrate schematic structural diagrams of five types of light-emitting units.

In order to further improve the injection efficiency of the electrons and the holes and further improve the luminous efficiency, referring to FIG. 2, the light-emitting unit further includes: a hole injection layer 8 and an electron injection layer 9; the hole injection layer 8 is disposed on a side of the hole transport layer 6 close to the anode 4 and in contact with the anode 4; the electron injection layer 9 is disposed on a side of the electron transport layer 7 close to the cathode 5 and in contact with the cathode 5.

There are no restrictions on the materials of the electric injection layer and the hole injection layer. For example, the material of the hole injection layer may include single-component materials, such as any one of HATCN, 2T-NATA, CuPc, $MoO_3$ (molybdenum trioxide). Here, HATCN refers to 2,3,6,7,10,11-hexacyano-1,4,5,8,9,12-hexaazatriphenylene, and its chemical structure formula is

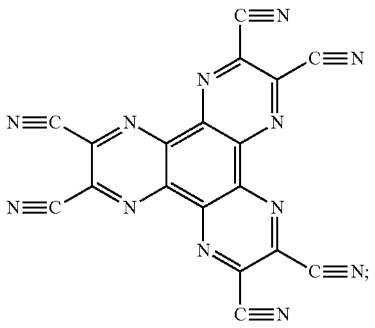 [SMILES: N#Cc1nc2c3nc(C#N)c(C#N)nc3c3nc(C#N)c(C#N)nc3c2nc1C#N]

CuPc refers to copper(II) phthalocyanine, and its chemical structure formula is

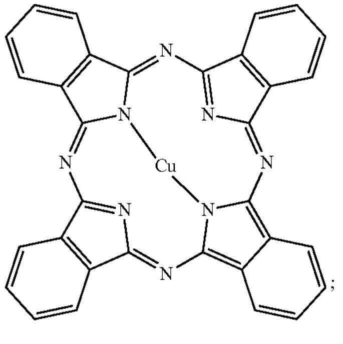

$MoO_3$ refers to molybdenum trioxide. Or, the material of the hole injection layer may include multi-component materials, such as radialene or quinone compounds doped with aromatic amine compounds. For example, the multi-component materials maybe F4TCNQ doped with NPB or TPD. Here the chemical structure formula of F4TCNQ is

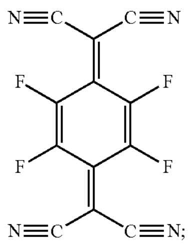 [SMILES: N#CC(C#N)=c1c(F)c(F)c(=C(C#N)C#N)c(F)c1F]

NPB refers to N,N'-Bis(1-naphthalenyl)-N,N'-bisphenyl-(1, 1'-biphenyl)-4,4'-diamine, and its chemical structure formula is

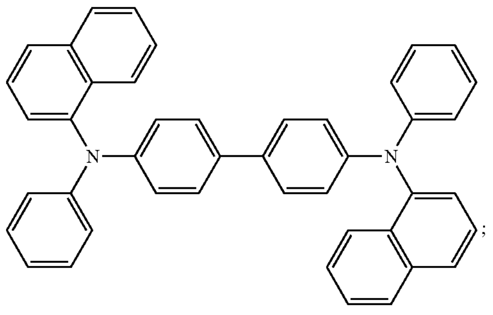 [SMILES: c1ccc(N(c2ccc(-c3ccc(N(c4ccccc4)c4cccc5ccccc45)cc3)cc2)c2cccc3ccccc23)cc1]

TPD refers to N,N'-bis(3-methylphenyl)-N,N-diphenyl-benzidine, and its chemical structure formula is

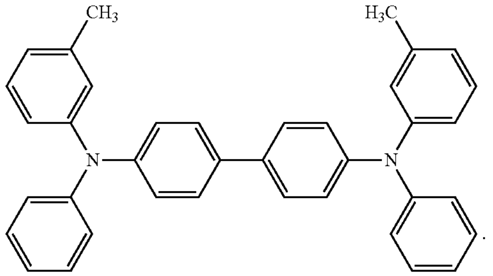 [SMILES: Cc1cccc(N(c2ccccc2)c2ccc(-c3ccc(N(c4ccccc4)c4cccc(C)c4)cc3)cc2)c1]

The material of the electron injection layer may include any one of LiF, Yb, and Liq. Here LiF refers to lithium fluoride. Yb is ytterbium; Liq is 8-Hydroxyquinolinolato-lithium, and its chemical structure formula is

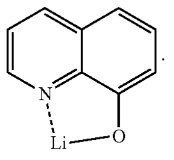

Figure 3:
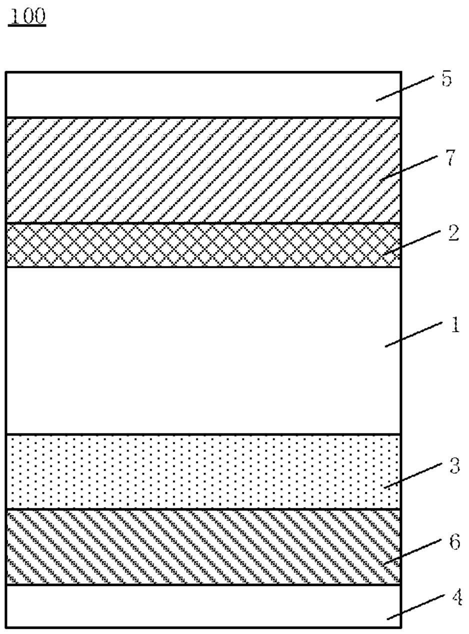

Certainly, in order to simplify the structure, referring to FIG. 3, the electric transport layer 7 may be contacted with the cathode 5, and the electric injection layer is not set between them; and the hole transport layer 6 may be contacted with the anode 4, and the hole injection layer 6 is not set between them.

Optionally, referring to the light-emitting device shown in FIG. 2 and FIG. 3, a thickness range of the hole functional layer is 5-200 nm, and a thickness range of the electron functional layer is 5-20 nm. Referring to FIG. 2, the thickness of the hole functional layer is H1 shown in FIG. 2, the thickness of the electron functional layer is H2 shown in FIG. 2.

The light emitting colors of the light-emitting units are different, and the thickness ranges of the electric functional layer and the hole functional layer are also different. Optionally, the light-emitting unit is the red light-emitting unit, the thickness range of the hole functional layer is 5-150 nm, and the thickness range of the electron functional layer is 5-20 nm. Optionally, the light-emitting unit is the green light-emitting unit, the thickness range of the hole functional layer is 5-100 nm, and the thickness range of the electron functional layer is 5-20 nm. Optionally, the light-emitting unit is the blue light-emitting unit, the thickness range of the hole functional layer is 5-40 nm, and the thickness range of the electron functional layer is 5-20 nm. The specific thickness values of the electric functional layer and the hole functional layer need to be selected according to the actual situation, which will not be listed here.

Another light-emitting device is provided below, in one or more embodiments, referring to FIG. 4 and FIG. 5, the light-emitting unit further includes: a hole injection layer 8 and an electron injection layer 9; the hole injection layer 8 is disposed on a side of the hole functional layer 3 close to the anode 4 and in contact with the hole functional layer 3; the electron injection layer 9 is disposed on a side of the electron functional layer 2 close to the cathode 5 and in contact with the electron functional layer 2.

In the light-emitting device, the hole functional layer is not only used to block the electrons, but also to transport the holes. At the same time, it also acts as an electron barrier layer and the hole transport layer. The electric functional layer is not only used to block the holes, but also to transport the electrons. It also acts as a hole barrier layer and the electric transport layer. The materials of the hole injection layer and the electric injection layer are not limited. For details, please refer to the above description, which is not repeated here.

Figure 4:
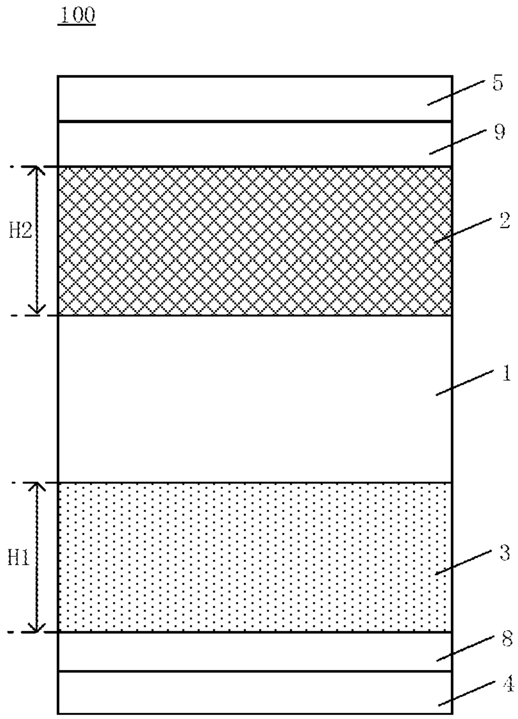
Figure 5:
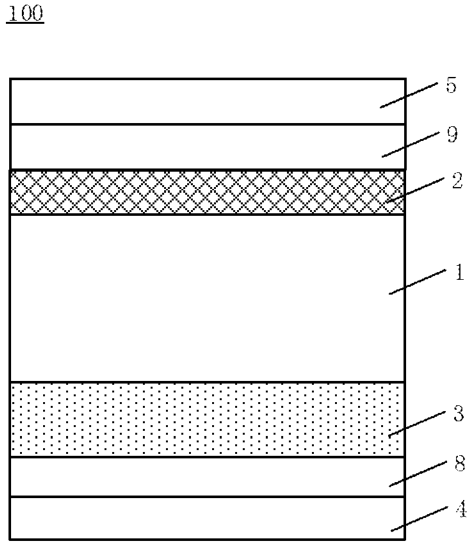

In the structure shown in FIG. 4 and FIG. 5, the thicknesses of the electric functional layers of the two structures are different, and the thicknesses of the hole functional layer are also different. Referring to FIG. 5, the thickness of the electric functional layer may be the same as that of the electric functional layer of the structure shown in FIG. 2, and the thickness of the hole functional layer may be the same as that of the hole functional layer of the structure shown in FIG. 2. Alternatively, referring to FIG. 4, the thickness of the electric functional layer may be the same as the total thickness of the electric functional layer and the electric transport layer of the structure shown in FIG. 2, and the thickness of the hole functional layer may be the same as the total thickness of the hole functional layer and the hole transport layer of the structure shown in FIG. 2. The specific thicknesses of the electric functional layer and the hole functional layer may be determined according to actual requirements.

Yet another light-emitting device is provided below, in one or more embodiments, referring to FIG. 6, the hole functional layer 3 is in contact with the anode 4, and the electron functional layer 2 is in contact with cathode 5.

In the light-emitting device, the hole functional layer is not only used to block the electrons, but also to transport the holes. At the same time, it also acts as the electron barrier layer and the hole transport layer. The electric functional layer is not only used to block the holes, but also to transport the electrons. It also acts as the hole barrier layer and the electric transport layer. In addition, the light emitting device is not provided with the hole injection layer and the electron injection layer, and the structure is simpler.

Figure 6:
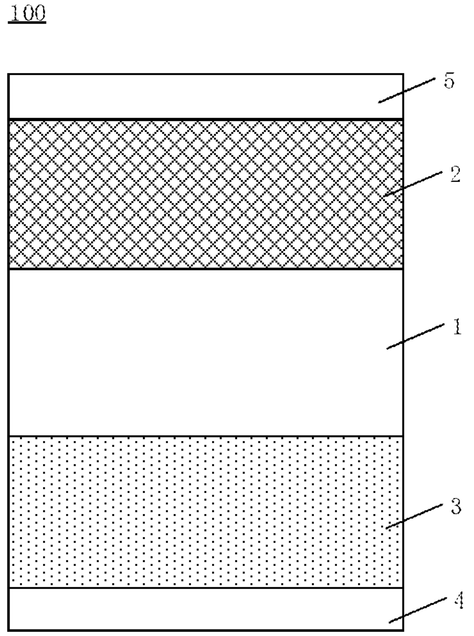

Optionally, referring to the light-emitting device shown in FIG. 4 to FIG. 6, the thickness range of the hole functional layer is 5-300 nm, and the thickness range of the electron functional layer is 5-100 nm. Referring to FIG. 4, the thickness of the hole functional layer is H1 shown in FIG. 4, the thickness of the electron functional layer is H2 shown in FIG. 4.

The light emitting colors of the light-emitting units are different, and the thickness ranges of the electric functional layer and the hole functional layer are also different. Optionally, the light-emitting unit is the red light-emitting unit, the thickness range of the hole functional layer is 5-300 nm, and the thickness range of the electron functional layer is 5-100 nm. Optionally, the light-emitting unit is the green light-emitting unit, the thickness range of the hole functional layer is 5-250 nm, and the thickness range of the electron functional layer is 5-100 nm. Optionally, the light-emitting unit is the blue light-emitting unit, the thickness range of the hole functional layer is 5-200 un, and the thickness range of the electron functional layer is 5-100 nm. The specific thickness values of the electric functional layer and the hole functional layer need to be selected according to the actual situation, which will not be listed here.

The present application does not limit the materials of the cathode and the anode. Optionally, the material of the anode includes transparent materials, such as Indium Tin Oxide (ITO), and the material of the cathode includes opaque materials, such as metal materials. At this time, the light formed by the luminescent layer is emitted from the anode and may be used in the bottom emitting device. Alternatively, the material of the anode includes the opaque materials, such as the metal materials, and the material of the cathode includes the transparent materials, such as Indium Tin Oxide (ITO). At this time, the light formed by the luminescent layer is emitted from the cathode and may be used in the top emitting device.

In one or more embodiments, the hole transport materials include: aromatic amine materials or branched polymer family materials, the electron transport materials include: aromatic compound materials.

In one or more embodiments, the hole transport materials include: a compound C and/or a derivative of the compound C, and the compound C includes: triphenylamine, fluorene, spirofluorene or phenothiazine.

The hole transport materials include the compound C and/or the derivative of the compound C, which includes three cases: first, the hole transport materials include the compound C; second, the hole transport materials include the derivative of the compound C; third, the hole transport materials include the compound C and the derivative of the compound C.

The electron transport materials include: heterocyclic compound, the heterocyclic compound includes: a D functional group and an E atom, the D functional group includes: naphthalene, anthracene, quinoline or triazine, and the E atom includes: nitrogen atom, phosphorus atom or sulfur atom.

In one or more embodiments, the light-emitting unit is the red light-emitting unit, the hole transport materials include: a triphenylamine group and a dibenzothiophene functional group, or the triphenylamine group and a dibenzofuran functional group; the electron transport materials include: a fast group and a first functional group, the first group includes: a triazine group, a quinoline group, a naphthalene group or an anthracene group, and the first functional group includes: a carbazole functional group or a fluorene functional group.

In one or more embodiments, the light-emitting unit is the green light-emitting unit, the hole transport materials include: the triphenylamine group and the carbazole functional group, or the triphenylamine group and a spirofluorene functional group, and the electron transport materials include: the triazine group and the carbazole functional group, or the triazine group and the dibenzofuran functional group.

In one or more embodiments, the light-emitting unit is the blue light-emitting unit, the hole transport materials include: the triphenylamine group, a second functional group and a third functional group, the second functional group includes the carbazole functional group or the spirofluorene functional group, the third functional group includes a naphthalene functional group or an anthracene functional group, the electron transport materials include a fourth functional group, and the fourth functional group includes: a triazine functional group, the naphthalene functional group, the anthracene functional group or a fluorene functional group.

In one or more embodiments, the light-emitting unit is the red light-emitting unit, and a thickness range of the luminescent layer is 20-80 nm. In one or more embodiments, the light-emitting unit is the green light-emitting unit, and the thickness range of the luminescent layer is 20-60 nm. In one or more embodiments, the light-emitting unit is the blue light-emitting unit, and the thickness range of the luminescent layer is 10-50 nm. Referring to FIG. 2 and FIG. 4, the thickness of the luminescent layer is H shown in FIG. 2 and FIG. 4.

In one or more embodiments, a range of a doping ratio of the guest materials in the luminescent layer includes: 0.1%-20%. Specific doping ratio can be selected according to specific materials.

The embodiment of the present application also provides a display apparatus, which includes the above light-emitting device.

The display apparatus may be a flexible display apparatus (also known as a flexible screen) or a rigid display apparatus (that is, a display apparatus that cannot be bent). There is no limit here. The display apparatus may be an organic light-emitting diode (OLED) display apparatus, and may also be any product or component with display functions including OLED TV, digital camera, mobile phone, tablet computer, etc. The display apparatus has the advantages of good display effect, long life, high stability and high contrast.

Figure 7:
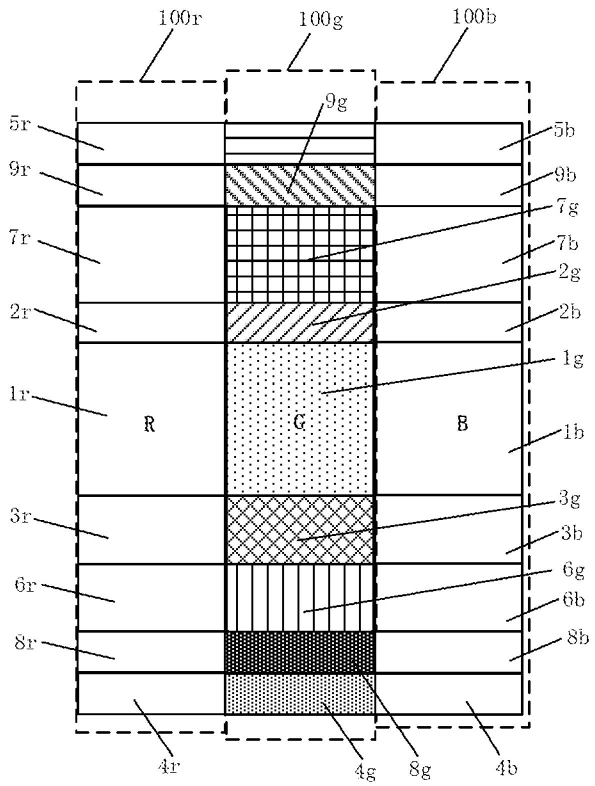
FIG. 7 and FIG. 8 illustrate schematic structural diagrams of two types of display apparatuses.
Figure 8:
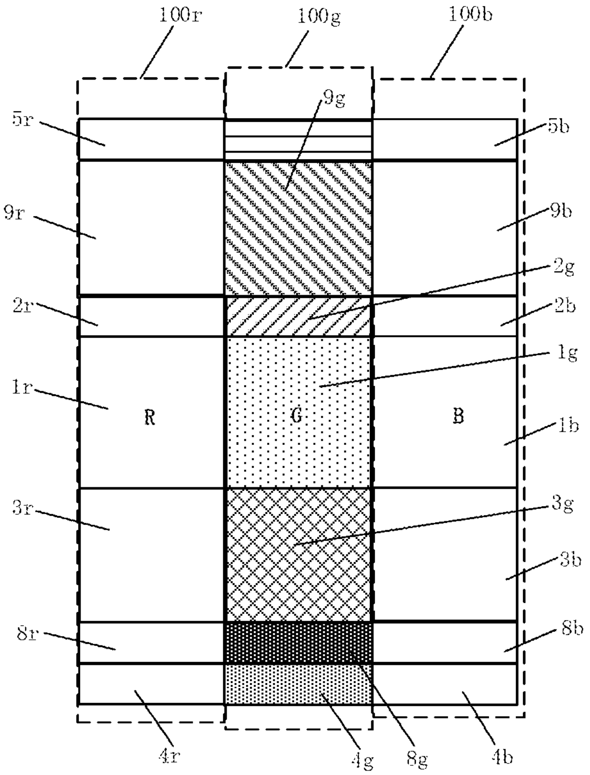

Referring to FIG. 7 and FIG. 8, the display apparatus may include the red light-emitting unit 100*r*, the green light-emitting unit 100*g*, and the blue light-emitting unit 100*b* at the same time. In order to distinguish various film layers of the red light-emitting unit, the green light-emitting unit and the blue light-emitting unit, the same film layer of the light-emitting units with different light emitting colors is marked with r, g and b, respectively. For example, take the luminescent layer 1 as an example. The luminescent layer marked with 1$r$ represents the luminescent layer in the red light-emitting unit, the luminescent layer marked with 1$g$ represents the luminescent layer in the green light-emitting unit, and the luminescent layer marked with 1$b$ represents the luminescent layer in the blue light-emitting unit. Other film layers are similar to this, and will not be explained here. In FIG. 7, the structure of the light-emitting unit of the display apparatus is the same as that shown in FIG. 2. Taking the red light-emitting unit as an example, the red light-emitting unit includes the anode 4$r$, the hole injection layer 8$r$, the hole transport layer 6$r$, the hole functional layer 3$r$, the luminescent layer 1$r$, the electric functional layer 2$r$, the electric transport layer 7$r$, the electric injection layer 9$r$, and the cathode 5$r$; in FIG. 8, the structure of the light-emitting unit of the display apparatus is the same as that shown in FIG. 4. Taking the red light-emitting unit as an example, the red light-emitting unit includes the anode 4$r$, the hole injection layer 8$r$, the hole functional layer 3$r$, the luminescent layer 1$r$, the electric functional layer 2$r$, the electric injection layer 9$r$ and the cathode 5$r$.

The embodiment of the present application provides a preparation method of the above light-emitting device, including:

S10, forming at least one light-emitting unit.

The above S10, forming at least one light-emitting unit includes:

S20, forming a luminescent layer, an electron functional layer and a hole functional layer. The electron functional layer and the hole functional layer are disposed on opposite sides of the luminescent layer; the material of the luminescent layer includes: the host materials, and the guest materials doped in the host materials, the host materials include: the hole transport materials and the electron transport materials; the material of the electron functional layer is the same as the electron transport materials, and the material of the hole functional layer is the same as the hole transport materials; the energy value $HOMO_A$ of the highest occupied molecular orbital of the hole transport materials and the energy value $HOMO_B$ of the highest occupied molecular orbital of the electron transport materials satisfy: $HOMO_A-HOMO_B>0.2$ eV; and the energy value $LUMO_A$ of the lowest unoccupied molecular orbital of the hole transport materials and the energy value $LUMO_B$ of the lowest unoccupied molecular orbital of the electron transport materials satisfy: $LUMO_A-LUMO_B>0.2$ eV.

There is no restriction on the formation order of the luminescent layer, the electric functional layer and the hole functional layer in S20. For example, the hole functional layer, the luminescent layer and the electric functional layer may be formed in sequence. Alternatively, the electric functional layer, the luminescent layer and the hole functional layer may be formed in sequence.

The above description of various film layers may refer to the above embodiments, which will not be repeated here.

In the light-emitting device formed by the above method, the material of the electron functional layer is the same as a kind of the host materials of the luminescent layer, that is, the electron transport material. The material of the hole functional layer is the same as that of a host material of the luminescent layer, namely, the hole transport material, which can simplify the manufacturing process and reduce the cost.

In order to reduce costs, reduce production time and improve yield. Optionally, S20, forming a luminescent layer, an electron functional layer and a hole functional layer, includes:

S30, evaporating by using a same evaporation chamber to form the luminescent layer, the electron functional layer and the hole functional layer.

Optionally, S30, evaporating by using a same evaporation chamber to form the luminescent layer, the electron functional layer and the hole functional layer, includes:

S40, evaporating in sequence by using the same evaporation chamber to form the hole functional layer, the luminescent layer and the electron functional layer; or S50, evaporating in sequence by using the same evaporation chamber to form the electron functional layer, the luminescent layer and the hole functional layer.

Figure 9:
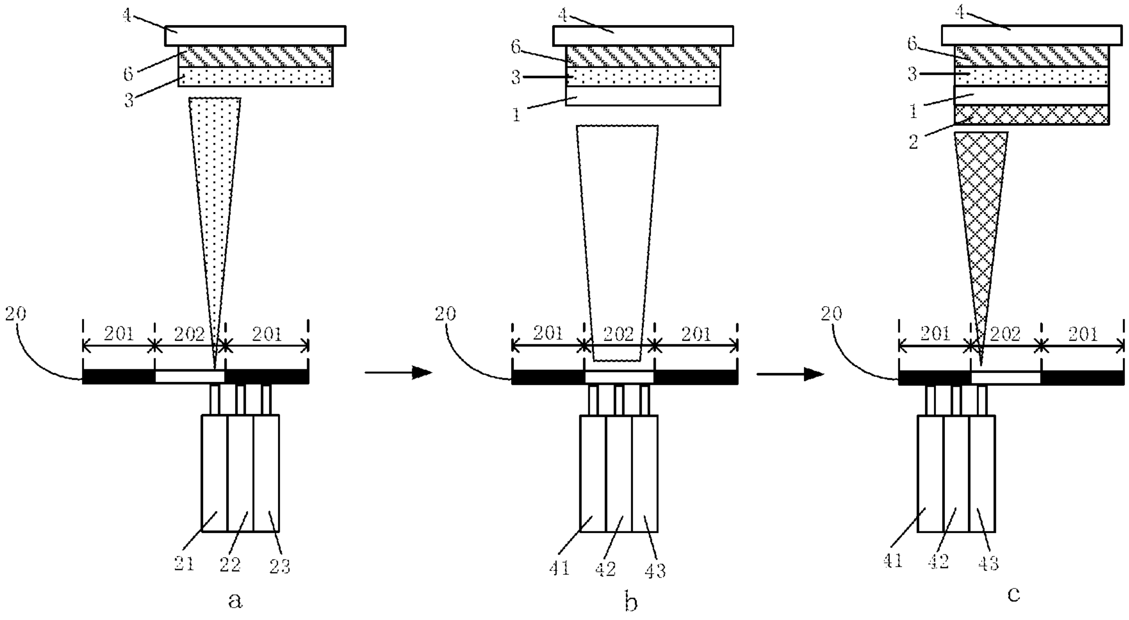
FIG. 9 illustrates a flow chart of the evaporation of a light-emitting unit, where plan a is a schematic diagram of forming a hole functional layer, plan b is a schematic diagram of forming a luminescent layer, and plan c is a schematic diagram of forming an electron functional layer.

Take the formation of the hole functional layer, the luminescent layer and the electric functional layer in sequence on the substrate as an example. Referring to FIG. 9, the substrate 200 formed with the hole transport layer 6 is put into an evaporation chamber, the shutter 20 includes an open area 202 and a non-open area 201, and the evaporation sources includes a hole transport material source 41, a guest material source 42 and an electric transport material source 43. Referring to plan a in FIG. 9, align the opening area 202 of the shutter 20 with the hole transport material source 41 of the evaporation sources, so as to form the hole functional layer 3 by evaporation. Then, referring to plan b in FIG. 9, move the shutter 20 so that the opening area 202 of the shutter 20 is aligned with the hole transport material source 41, the guest material source 42 and the electric transport material source 43 of the evaporation sources, so as to form the luminescent layer 1 by the evaporation. Then, referring to plan c in FIG. 9, move the shutter 20 so that the opening area 202 of the shutter 20 is aligned with the electric transport material source 43 of the evaporation sources, thus forming the electric functional layer 2 by the evaporation. Using the method, only one mask plate is needed and aligned once, greatly reducing the evaporation time and cost, and improving the yield.

The "one embodiment", "embodiment" or "one or more embodiments" mentioned herein means that the specific features, structures or features described in combination with the embodiments are included in at least one embodiment of the present application. In addition, please note that the word "in one embodiment" does not necessarily refer to the same embodiment.

A large number of specific details are described in the specification provided here. However, it can be understood that the embodiments of the present application can be practiced without these specific details. In some embodiments, the well-known methods, structures and techniques are not shown in detail so as not to obscure the understanding of the specification. Finally, it should be noted that the above embodiments are only used to illustrate the technical solution of the application, not to limit it. Although the present application has been described in detail with reference to the preceding embodiments, those skilled in the art should understand that they can still modify the technical solutions recorded in the preceding embodiments or replace some of the technical features equally. However, these modifications or substitutions do not make the essence of the corresponding technical solutions deviate from the spirit and scope of the technical solutions of the embodiments of the present application.

The invention claimed is:

1. A light-emitting device, comprising: at least one light-emitting unit, wherein the light-emitting unit comprises: a luminescent layer, an electron functional layer and a hole functional layer, and the electron functional layer and the hole functional layer are disposed on opposite sides of the luminescent layer;

a material of the luminescent layer comprises: host materials and guest materials doped in the host materials, and the host materials comprise: hole transport materials and electron transport materials;

a material of the electron functional layer is the same as the electron transport materials, and a material of the hole functional layer is the same as the hole transport materials;

wherein an energy value $HOMO_A$ of a highest occupied molecular orbital of the hole transport materials and an energy value $HOMO_B$ of a highest occupied molecular orbital of the electron transport materials satisfy: $HOMO_A-HOMO_B>0.2$ eV; and an energy value $LUMO_A$ of a lowest unoccupied molecular orbital of the hole transport materials and an energy value LUMOs of a lowest unoccupied molecular orbital of the electron transport materials satisfy: $LUMO_A-LUMO_B>0.2$ eV.

2. The light-emitting device according to claim 1, wherein the energy value $HOMO_A$ of the highest occupied molecular orbital of the hole transport materials satisfies: $-5.7$ eV$\leq HOMO_A\leq -5.1$ eV; and the energy value $LUMO_A$ of the lowest unoccupied molecular orbital of the hole transport materials satisfies: $-2.7$ eV$\leq LUMO_A\leq -2.0$ eV; and the energy value $HOMO_B$ of the highest occupied molecular orbital of the electron transport materials satisfies: $-6.2$ eV$\leq HOMO_B\leq -5.4$ eV; and the energy value $LUMO_B$ of the lowest unoccupied molecular orbital of the electron transport materials satisfies: $-3.1$ eV$\leq LUMO_B\leq -2.3$ eV.

3. The light-emitting device according to claim 1, wherein the light-emitting unit further comprises: an anode and a cathode, the anode is disposed on a side of the hole functional layer away from the luminescent layer, and the cathode is disposed on a side of the electron functional layer away from the luminescent layer.

4. The light-emitting device according to claim 3, wherein the light-emitting unit further comprises: a hole transport layer and an electron transport layer; the hole transport layer is disposed on a side of the hole functional layer close to the anode and in contact with the hole functional layer; and the electron transport layer is disposed on a side of the electron functional layer close to the cathode and in contact with the electron functional layer.

5. The light-emitting device according to claim 4, wherein the light-emitting unit further comprises: a hole injection layer and an electron injection layer; the hole injection layer is disposed on a side of the hole transport layer close to the anode and in contact with the anode; and the electron injection layer is disposed on a side of the electron transport layer close to the cathode and in contact with the cathode.

6. The light-emitting device according to claim 4, wherein a thickness range of the hole functional layer is 5-200 nm, and a thickness range of the electron functional layer is 5-20 nm.

7. The light-emitting device according to claim 6, wherein the light-emitting unit is a red light-emitting unit, the thickness range of the hole functional layer is 5-150 nm, and the thickness range of the electron functional layer is 5-20 nm.

8. The light-emitting device according to claim 6, wherein the light-emitting unit is a green light-emitting unit, the thickness range of the hole functional layer is 5-100 nm, and the thickness range of the electron functional layer is 5-20 nm.

9. The light-emitting device according to claim 6, wherein the light-emitting unit is a blue light-emitting unit, the thickness range of the hole functional layer is 5-40 nm, and the thickness range of the electron functional layer is 5-20 nm.

10. The light-emitting device according to claim 3, wherein the light-emitting unit further comprises: a hole injection layer and an electron injection layer; the hole injection layer is disposed on a side of the hole functional layer close to the anode and in contact with the hole functional layer; and the electron injection layer is disposed on a side of the electron functional layer close to the cathode and in contact with the electron functional layer.

11. The light-emitting device according to claim 3, wherein the hole functional layer is in contact with the anode, and the electron functional layer is in contact with cathode.

12. The light-emitting device according to claim 10, wherein a thickness range of the hole functional layer is 5-300 nm, and a thickness range of the electron functional layer is 5-100 nm.

13. The light-emitting device according to claim 12, wherein the light-emitting unit is a red light-emitting unit, the thickness range of the hole functional layer is 5-300 nm, and the thickness range of the electron functional layer is 5-100 nm; or the light-emitting unit isa green light-emitting unit, the thickness range of the hole functional layer is 5-250nm, and the thickness range of the electron functional layer is 5-100nm; or the light-emitting unit is a blue light-emitting unit, the thickness range of the hole functional layer is5-200nm, and the thickness range of the electron functional layer is 5-100nm.

14. The light-emitting device according to claim 3, wherein a material of the anode comprises: transparent materials, and a material of the cathode comprises: opaque materials; or, the material of the anode comprises: opaque materials, and the material of the cathode comprises: transparent materials.

15. The light-emitting device according to claim 1, wherein the hole transport materials comprise: aromatic amine materials or branched polymer family materials, and the electron transport materials comprise: aromatic compound materials; or the hole transport materials comprise; a compound C and/or a derivative of the compound C, and the compound C comprises: triphenylamine, fluorene, spirofluorene or phenothiazine; and the electron transport materials comprise: heterocyclic compound, the heterocyclic compound comprises: a D functional group and an E atom, the D functional group comprises: naphthalene, anthracene, quinoline or triazine, and the E atom comprises: nitrogen atom, phosphorus atom or sulfur atom.

16. The light-emitting device according to claim 1, wherein the light-emitting unit is a red light-emitting unit, the hole transport materials comprise: a triphenylamine group and a dibenzothiophene functional group, or the triphenylamine group and a dibenzofuran functional group; the electron transport materials comprise: a first group and a first functional group, the first group comprises: a triazine group, a quinoline group, a naphthalene group or an anthracene group, and the first functional group comprises: a carbazole functional group or a fluorene functional group; or the light-emitting unit is a green light-emitting unit, the hole transport materials comprise: a triphenylamine group and a carbazole functional group, or the triphenylamine group and a spirofluorene functional group, and the electron transport materials comprise: a triazine group and a carbazole functional group, or the triazine group and a dibenzofuran functional group; or the light-emitting unit is a blue light-emitting unit, the hole transport materials comprise: a triphenylamine group, a second functional group and a third functional group, the second functional group comprises a carbazole functional group or a spirofluorene functional group, the third functional group comprises a naphthalene functional group or an anthracene functional group, the electron transport materials comprise a fourth functional group, and the fourth functional group comprises: a triazine functional group, the naphthalene functional group, the anthracene functional group or a fluorene functional group.

17. The light-emitting device according to claim 1, wherein the light-emitting unit is a red light-emitting unit, and a thickness range of the luminescent layer is 20-80 nm; or the light-emitting unit is a green light-emitting unit, and a thickness range of the luminescent layer is 20-60 nm; or the light-emitting unit is a blue light-emitting unit, and a thickness range of the luminescent layer is 10-50 nm.

18. A display apparatus, comprising: the light-emitting device according to claim 1.

19. A preparation method of the light-emitting device according to claim 1, comprising:

forming at least one light-emitting unit; and the forming at least one light-emitting unit comprises:

forming a luminescent layer, an electron functional layer and a hole functional layer, wherein the electron functional layer and the hole functional layer are disposed on opposite sides of the luminescent layer; a material of the luminescent layer comprises: host materials and guest materials doped in the host materials, the host materials comprise: hole transport materials and electron transport materials; a material of the electron functional layer is the same as the electron transport materials, and a material of the hole functional layer is the same as the hole transport materials; an energy value $HOMO_A$ of a highest occupied molecular orbital of the hole transport materials and an energy value $HOMO_B$ of a highest occupied molecular orbital of the electron transport materials satisfy: $HOMO_A-HOMO_B>0.2$ eV; and an energy value $LUMO_A$ of a lowest unoccupied molecular orbital of the hole transport materials and an energy value $LUMO_B$ of a lowest unoccupied molecular orbital of the electron transport materials satisfy: $LUMO_A-LUMO_B>0.2$ eV.

20. The method according to claim 10, wherein the forming a luminescent layer, an electron functional layer and a hole functional layer comprises:

evaporating by using a same evaporation chamber to form the luminescent layer, the electron functional layer and the hole functional layer.

* * * * *